(12) United States Patent
Ide

(10) Patent No.: US 10,869,408 B2
(45) Date of Patent: Dec. 15, 2020

(54) ELECTRONIC DEVICE

(71) Applicant: SHARP KABUSHIKI KAISHA, Sakai (JP)

(72) Inventor: Tomoya Ide, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 16/601,948

(22) Filed: Oct. 15, 2019

(65) Prior Publication Data

US 2020/0128690 A1 Apr. 23, 2020

(30) Foreign Application Priority Data

Oct. 19, 2018 (JP) .................................. 2018-197723

(51) Int. Cl.
| | | |
|---|---|---|
| *H05K 7/20* | (2006.01) | |
| *H05K 1/02* | (2006.01) | |
| *H01Q 1/22* | (2006.01) | |
| *G06F 1/20* | (2006.01) | |
| *H01Q 1/36* | (2006.01) | |

(52) U.S. Cl.
CPC ............. *H05K 7/2039* (2013.01); *G06F 1/20* (2013.01); *H01Q 1/22* (2013.01); *H01Q 1/36* (2013.01); *H05K 1/0203* (2013.01); *H05K 7/20963* (2013.01)

(58) Field of Classification Search
CPC ...... G06F 1/20; H05K 1/0203; H05K 1/0204; H05K 7/2039; H05K 7/20963; H01Q 1/22; H01Q 1/36
See application file for complete search history.

(56) References Cited

U.S. PATENT DOCUMENTS

| | | | | |
|---|---|---|---|---|
| 9,582,051 B2* | 2/2017 | Jang | ........................ | G06F 1/203 |
| 2013/0017867 A1* | 1/2013 | Lee | ........................ | H01Q 1/243 |
| | | | | 455/566 |
| 2013/0287002 A1* | 10/2013 | Kim | ..................... | H04W 36/16 |
| | | | | 370/331 |
| 2014/0078679 A1* | 3/2014 | Tsunoda | ............. | H05K 7/20445 |
| | | | | 361/720 |
| 2015/0075186 A1* | 3/2015 | Prajapati | ................. | F25B 21/02 |
| | | | | 62/3.7 |
| 2015/0123860 A1* | 5/2015 | Park | ........................ | H01Q 1/22 |
| | | | | 343/720 |
| 2016/0372837 A1* | 12/2016 | Jung | ...................... | H01Q 1/243 |
| 2017/0155746 A1* | 6/2017 | Yang | .................. | H05K 7/20509 |
| 2018/0205131 A1* | 7/2018 | Hwang | ................. | H04M 1/026 |
| 2018/0288908 A1* | 10/2018 | Lee | .................... | H05K 7/20454 |
| 2019/0041922 A1* | 2/2019 | Kurma Raju | ......... | G06F 1/1681 |

FOREIGN PATENT DOCUMENTS

| | | |
|---|---|---|
| CN | 102800923 A | 11/2012 |
| JP | 2008-131501 A | 6/2008 |

* cited by examiner

*Primary Examiner* — Jacob R Crum
(74) *Attorney, Agent, or Firm* — ScienBiziP, P.C.

(57) ABSTRACT

An electronic device includes a first metal plate that absorbs heat of a first heat generation source configured by a first heat generation component that generates heat inside the electronic device and a second metal plate that absorbs heat of a second heat generation source configured to include at least an antenna module, and the second metal plate is disposed at a position separated from the first metal plate.

6 Claims, 3 Drawing Sheets

ELECTRONIC DEVICE

BACKGROUND

1. Field

The present disclosure relates to an electronic device.

2. Description of the Related Art

In the related art, research on heat dissipation of the electronic devices has been made. In Japanese Unexamined Patent Application Publication No. 2008-131501 (published on Jun. 5, 2008), a portable terminal device which includes a heat absorption member absorbing heat generated from an electronic component mounted on a circuit board and in which the heat absorption member is disposed in a casing so as to face the electronic component is disclosed.

In the portable terminal device disclosed in Japanese Unexamined Patent Application Publication No. 2008-131501 (published on Jun. 5, 2008), it is not assumed that an antenna module is provided. In a case where the antenna module is provided in the portable terminal device, if heat generated from the antenna module and heat generated from the electronic component are absorbed by one heat absorption member, temperature of the heat absorption member becomes high due to the heat generated from the electronic component.

For that reason, the portable terminal device disclosed in Japanese Unexamined Patent Application Publication No. 2008-131501 (published on Jun. 5, 2008) has a problem that the heat generated from the antenna module may not be sufficiently dissipated. It is desirable to realize an electronic device capable of sufficiently dissipating heat generated from the antenna module to stabilize communication processing.

SUMMARY

According to an aspect of the present disclosure, there is provided an electronic device including a first heat absorber that absorbs heat of a first heat generation source configured by a first neat generation component that generates heat inside the electronic device and a second heat absorber that absorbs heat of a second heat generation source configured to include at least an antenna module, in which the second heat absorber is disposed at a position separated from the first heat absorber.

According to the configuration described above, since the second heat absorber is disposed at a position separated from the first heat absorber, the heat of the first heat generation source and the heat of the second heat generation source are absorbed by separate heat absorbers, respectively. With this configuration, heat generated from the antenna module can be sufficiently absorbed and dissipated, and communication processing can be stabilized.

Advantageous Effects of Invention

An aspect of the disclosure advantageously provides an electronic device capable of sufficiently absorbing and dissipating heat generated from an antenna module to stabilize communication processing.

DESCRIPTION OF THE EMBODIMENTS

Embodiment 1

Configuration of Electronic Device 1

Figure 1A:
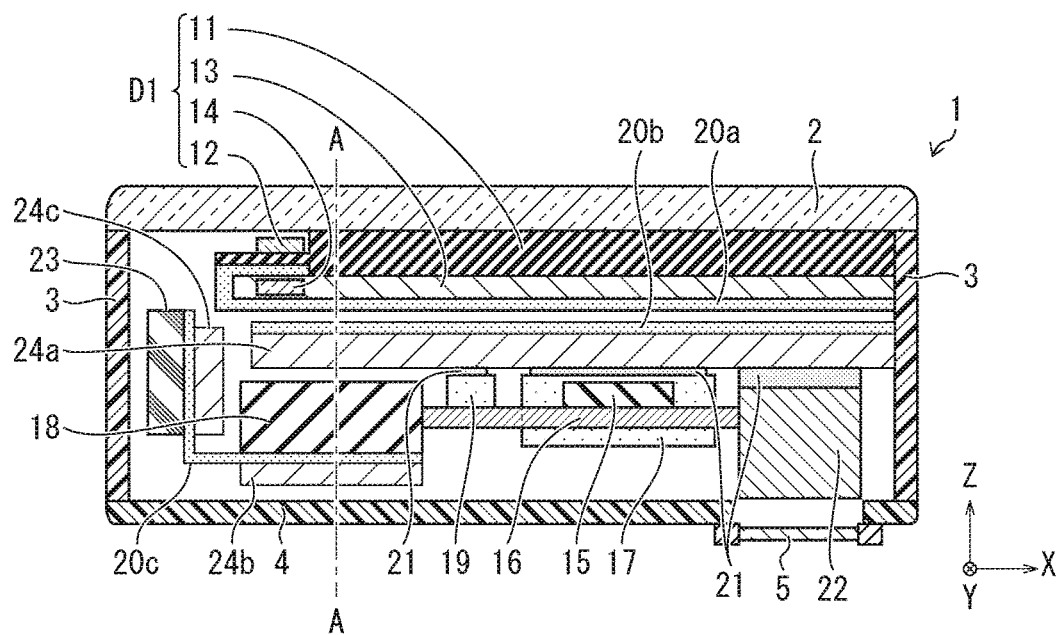
FIG. 1A is a cross-sectional view illustrating a cross-sectional configuration of an example of an electronic device according to Embodiment 1 of the present disclosure.
Figure 1B:
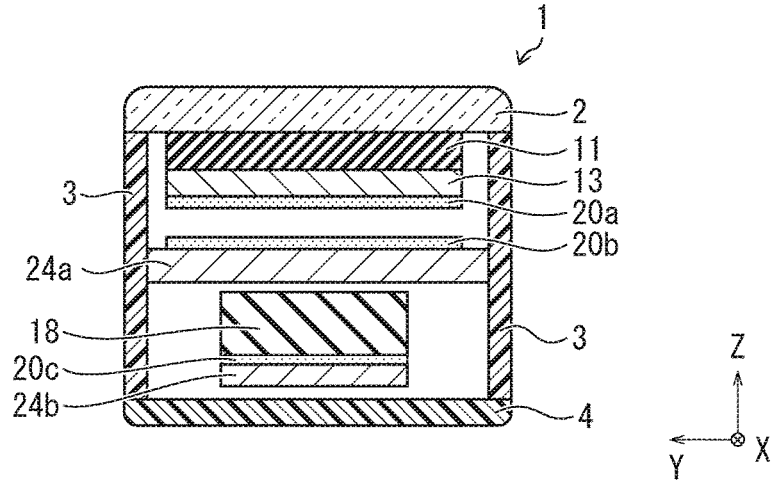
FIG. 1B is a cross-sectional view illustrating a cross-sectional configuration of the electronic device taken along line A-A illustrated in FIG. 1A.

FIG. 1A is a cross-sectional view illustrating a cross-sectional configuration of an example of an electronic device 1 according to Embodiment 1 of the present disclosure, and FIG. 1B is a cross-sectional view illustrating a cross-sectional configuration of the electronic device 1 taken along line A-A illustrated in FIG. 1A. The electronic device 1 is a portable multifunction information processing terminal (portable terminal) such as a smart phone or a tablet.

As illustrated in FIGS. 1A and 1B, the electronic device 1 includes a cover glass 2, side surface members 3, a back surface member 4, a lens 5, a liquid crystal unit 11, a driver circuit 12, a backlight unit 13, a light emitting diode (LED) 14, a control circuit 15, a substrate 16, a shield case 17, a battery 18, communication modem chip 19, heat dissipation sheets 20a and 20b for internal components, an antenna heat dissipation sheet 20c, a heat conduction member 21, a camera 22, an antenna module 23 (second heat generation component), a first metal plate 24a (first heat absorber), second metal plate 24b (second heat absorber), and a third metal plate 24c (second heat absorber). The electronic device 1 may not include the third metal plate 24c.

The cover glass 2 is a member that configures the front surface of the electronic device 1 and is configured to allow a user to visually recognize an image displayed by the liquid crystal unit 11. The cover glass 2 is provided above (positive direction of the Z-axis) the liquid crystal unit 11 and covers the driver circuit 12.

The side surface members 3 configure side surfaces of the electronic device 1 and are provided between the cover glass 2 and the back surface member 4. For example, each side surface member 3 may be made of the same material as the cover glass 2 or the back surface member 4, or may be made of resin or glass. For example, four side surface members 3 are provided to form four side surfaces of the electronic device 1, and the four side surfaces are configured by two side surfaces extending in the longitudinal direction (X-axis direction) of the electronic device 1 and two side surfaces extending in the lateral direction (Y-axis direction) of the electronic device 1.

The back surface member 4 is a member that configures the back surface of the electronic device 1. The back surface member 4 is made of, for example, resin. The cover glass 2, the side surface members 3, and the back surface member 4 are members that protect the inside of the electronic device 1. The cover glass 2, the side surface members and the back surface member 4 form a casing of the electronic device 1. In this case, the cover glass 2, the side surface members 3, and the back surface member configure the surfaces of the casing of the electronic device 1.

The cover glass 2, the side surface members and the back surface member 4 are portions that are easily touched by a user's hand when the electronic device 1 is gripped or operated. For that reason, the cover glass 2, the side surface members 3, and the back surface member are made of a mater having lower thermal conductivity than at least the first metal plate 24a, the second metal plate 24b, and the third metal plate 24c.

With this configuration, when a user's hand touches any one of the cover glass 2, the side surface members 3, and the back surface member 4, it can reduce that a user feels hot. The lens 5 is made of, for example, glass or plastic resin. The lens 5 is disposed below (negative direction of the Z-axis) the camera 22 built in the electronic device 1.

The liquid crystal unit 11 includes a liquid crystal panel that displays an image. The driver circuit 12 is a liquid crystal driver circuit that performs image display control on the liquid crystal unit 11 by controlling driving of the liquid crystal unit 11. The backlight unit 13 guides light from the LED 14 to the liquid crystal unit 11.

In this embodiment, a display panel D1 is configured by the liquid crystal unit 11, the driver circuit 12, the backlight unit 13, and the LED 14, but is not limited thereto. For example, the display panel D1 may include an organic light emitting diode (PLED) and a driver circuit (corresponding to the driver circuit 12) that controls driving of the PLED.

The di-play panel D1 may include, for example, an inorganic light emitting diode or a quantum dot light emitting diode (QLED), instead of the PLED. The display panel D1 may include the liquid crystal unit 11 and the driver circuit 12, and may not include the backlight unit 13 and the LED 14.

The control circuit 15 comprehensively controls the components included in the electronic device 1, and includes, for example, a central processing unit (CPU) and a graphics processing unit (GPU). The control circuit 15 is disposed on the substrate 16 and sealed with the shield case 17 that shields electromagnetic waves from the control circuit 15 or the outside. The shield case 17 is made of metal, for example.

The battery 18 is a power supply source for each component of the electronic device 1 and supplies power to the electronic device 1. The communication modem chip 19 is electrically connected to the antenna module 23 and controls the antenna module 23. The communication modem chip 19 is disposed on the substrate 16. The communication modem chip 19 operates simultaneously with the antenna module 23. The camera 22 images an object through the lens 5.

The antenna module 23 is a component that performs wireless communication with the outside of the electronic device 1 and includes wireless communication-related components such as an antenna and a power amplifier. The antenna is preferably a component for accessing a 5G channel, and more preferably a component capable of data communication using millimeter waves. The antenna may be a component for accessing a channel capable of data communication such as a 4G channel.

The antenna module 23 is preferably provided in the vicinity of the cover glass 2, the side surface member 3, and the back surface member 4 so that communication processing related to communication with the outside of the electronic device 1 is stabilized. In FIG. 1A, the antenna module 23 is provided in the vicinity of the side surface member 3. Heat of the antenna module 23 is largely due to heat of the power amplifier.

In the example of FIGS. 1A and 1B, examples of the heat generation components that generate heat inside the electronic device 1 include the driver circuit 12, the LED 14, the control circuit 15, the communication modem chip 19, the camera 22, and the antenna module 23. In the electronic device 1, all components that can affect the operation of its own components or peripheral components by generating heat during operation correspond to the heat generation components.

Here, each of the driver circuit 12, the LED 14, the control circuit 15, the communication modem chip 19, and the camera 22 is referred to as a first heat generation component. The first heat generation component is a heat generation component whose heat is absorbed by the first metal plate 24a. The display panel D1 is also referred to as the first heat generation component. Each first heat generation component or one heat generation component configured by an assembly of the first neat generation components is referred to as a first heat generation source.

Furthermore, the antenna module 23 or one antenna module configured by an assembly of the antenna module 23 and other component is referred to as a second heat generation source. The other components are components that generate heat in the vicinity of the cover glass 2 the side surface member 3, or the back surface member 4, in addition to the antenna module 23. That is, the second heat generation source is configured to include at least the antenna module 23. The second heat generation source is a heat generation source whose heat is absorbed by the second metal plate 24b and the third metal plate 24c. The other components may be components that generate heat at a place other than in the vicinity of the cover glass 2, the side surface member 3, or the back surface member 4, in addition to the antenna module 23.

The first metal plate 24a is a heat dissipation member having higher thermal conductivity than the cover glass 2, the side surface member 3, and the back surface member 4. For that reason, the first metal plate 24a can absorb heat generated inside the electronic device 1 in preference to the cover glass 2, the side surface member 3, and the back surface member 4. For example, aluminum or an aluminum alloy is used as the first metal plate 24a. The first metal plate 24a is disposed inside the electronic device 1.

The heat dissipation member is not necessarily the first metal plate 24a, and may be a member having thermal conductivity that can absorb heat generated inside the electronic device 1 and efficiently conduct the heat to the outside of the electronic device 1. The heat dissipation member may be made of, for example, a heat dissipation material (TIM: Thermal interface Material) such as silicone resin mixed with a heat conductive filler.

Thermal conductivity of a material used as the heat dissipation member may be a relatively high value with respect to the thermal conductivity of the material used as the cover glass 2, the side surface member 3, and the back surface member 4, for example, and is preferably 100 W/(m·K) or more. When the thermal conductivity of the material used as the heat dissipation member is 100 W/(m·K) or more, the absorbed heat can be efficiently conducted to the inside or the outside of the heat dissipation member.

The first metal plate 24a a plate-like member that efficiently absorbs heat generated from the display panel D1 disposed above (positive direction of the Z-axis) the first metal plate 24a and heat generated from the control circuit 15 and the camera 22 disposed below (negative direction of the Z-axis) the first metal plate 24a. That is, the first metal plate 24a is a plate-like member that is provided on the back surface side (negative direction side of the Z-axis) of the display panel D1 and absorbs heat from the first heat generation source. The first metal plate 24a extends inside the electronic device 1 in the vicinity of the center of the electronic device 1. However, the first metal plate 24a may be disposed at a position where the first metal plate 24a can efficiently absorb the heat generated from the first heat generation component.

The heat conduction member 21 is disposed between the first metal plate 24a and the control circuit 15. Specifically, the heat conduction member 21 is disposed between the first metal plate 24a and the shield case 17. In this case, the heat conduction member 21 conducts heat generated from the control circuit 15 to the first metal plate 24a.

The heat conduction member 21 is disposed between the first metal plate 24a and the communication modem chip 19. In this case, the heat conduction member 21 conducts heat generated from the communication modem chip 19 to the first metal plate 24a. Furthermore, the heat conduction member 21 is disposed between the first metal plate 24a and the camera 22. In this case, the heat conduction member 21 conducts heat generated from the camera 22 to the first metal plate 24a. The heat conduction member 21 is made of, for example, a heat dissipation material (TIM).

By disposing the heat conduction member 21 on the heat generation components, such as the control circuit 15, the communication modem chip 19, the camera 22, directly connected to the first metal plate 24a, the heat generated by the heat generation component can be efficiently conducted to the first metal plate 24a. Here, the heat conduction member 21 conducts heat generated from the heat generation component directly connected to the first metal plate 24a to the first metal plate 24a.

On the other hand, the heat dissipation sheet 20a and 20b for internal components and the antenna heat dissipation sheet 20c, which will be described later, conduct heat to the inside and outside of the electronic device while diffusing heat over a wide range. From this point of view, the thermal conductivity of the heat dissipation sheets 20a and 20b for internal components and the antenna heat dissipation sheet 20c may be higher than the thermal conductivity of the heat conduction member 21.

The battery 18 is not connected to the first metal plate 24a through the heat conduction member 21. This is because the battery 18 does not correspond to a heat generation component. When the battery 18 is connected to the first metal plate 24a, the battery 18 becomes hot due to heat from the first metal plate 24a, which is not desirable for safety.

The heat dissipation sheet 20a for internal components is a heat dissipation member that is disposed in the vicinity of the driver circuit 12 and the LED 14 and is stuck on the surface of the backlight unit 13 that faces the first metal plate 24a. In other words, the heat dissipation sheet 20a for internal components is a heat dissipation member that is stuck over a wide range across the surface of the backlight unit 13 on a side (negative direction side of the Z-axis) opposite to the liquid crystal unit 11 side. That is, the heat dissipation sheet 20a for internal components is provided on the display panel D1.

With this configuration, the heat dissipation sheet 20a for internal components can absorb heat generated from the driver circuit 12 and the LED 14. The absorbed heat can be conducted to an air layer formed between the heat dissipation sheet 20a for internal components and the heat dissipation sheet 20b for internal components. Even a case where heat is transmitted through an air layer in a narrow space, the term "conduction" is used in this specification.

The heat dissipation sheet 20b for internal components is a heat dissipation member stuck on the surface of the first metal plate 24a facing the backlight unit 13. In other words, the heat dissipation sheet 20b for internal components is a heat dissipation member that is stuck over a wide range across the surface of the first metal plate 24a on a side (positive direction side of the Z-axis) opposite to the control circuit 15 side. That is, the heat dissipation sheet 20b for internal components is provided on the first metal plate 24a.

With this configuration, the heat dissipation sheet 20b for internal components can absorb heat from the air layer formed between the heat dissipation sheet 20a for internal components and the heat dissipation sheet 20b for internal components. The heat dissipation sheet 20b for internal components can conduct the absorbed heat to the first metal plate 24a.

Accordingly, the heat dissipation sheets 20a and 20b for internal components conduct heat of the display panel D1 to the first metal plate 24a. With this configuration, since heat of the first heat generation source is conducted to the first metal plate 24a by the heat dissipation sheets 20a and 20b for internal components, and the first metal plate 24a is a plate-like member, a sufficient heat dissipation area is ensured, and thus higher heat dissipation can be performed.

The second metal plate 240 and the third metal plate 24c absorb heat of the second heat generation source. The same heat dissipation member as the first metal plate 24a may be used for the second metal plate 24b and the third metal plate 24c. The second metal plate 24b and the third metal plate 24c are disposed inside the electronic device 1. The second metal plate 24b and the third metal plate 24c have low thermal resistance only with respect to the second heat generation source. The second metal plate 24b and the third metal plate 24c are disposed at positions separated from the first metal plate 24a.

With this configuration, heat of the first heat generation source and heat of the second heat generation source are absorbed by separate heat absorbers, respectively. Therefore, a temperature difference is easily generated between the antenna module 23 and the second metal plate 24b and the third metal plate 24c, and heat generated from the antenna module 23 can be sufficiently absorbed and dissipated, and communication processing can be stabilized.

When the antenna module 23 includes an antenna for accessing the 5G channel, immediacy is demanded for communication in the antenna module 23, and thus immediacy can be improved by stabilizing communication processing, which is effective. Specifically, since the antenna module 23 is less susceptible to heat from other than itself, communication on the 5G channel can be used immediately without interruption of communication in the middle of the communication on the 5G channel due to communication restrictions caused by temperature.

Since heat is hardly conducted between the second metal plate 24b and the third metal plate 24c and the first metal plate 24a, even if the temperature of the first metal plate 24a rises, the second metal plate 24b and the third metal plate 24c can maintain a sufficiently low temperature. A case where the antenna module 23 is provided in the vicinity of the cover glass 2, the side surface member 3, and the back surface member 4 is assumed. In this case, since heat generated from the antenna module 23 can be sufficiently absorbed and dissipated, occurrence of hot spots on the cover glass 2, the side surface member 3, and the back surface member 4 can be reduced.

The first heat generation source includes the communication modem chip 19 that controls the antenna module 23 as the first heat generation component. As described above, since the heat of the first heat generation source and the heat of the second heat generation source are absorbed by separate heat absorbers, respectively, the heat of the antenna module 23 and the heat of the communication modem chip 19 are absorbed by separate heat absorbers, respectively. With this configuration, the heat generated from each of the antenna module 23 and the communication modem chip 19 can be efficiently dissipated, and communication processing can be stabilized.

The antenna heat dissipation sheet 20c is a heat dissipation member provided on the antenna module 23, the second metal plate 24b, and the third metal plate 24c. Specifically, the antenna heat dissipation sheet 20c is disposed across the antenna module 23, the second metal plate 24b, and the third metal plate 24c. With this configuration, the antenna heat dissipation sheet 20c can conduct heat of the antenna module 23 to the second metal plate 24b and the third metal plate 24c. Accordingly, the heat generated from the antenna module 23 can be conducted to the second metal plate 24b and the third metal plate 24c through the antenna heat dissipation sheet 20c. Therefore, the heat generated from the antenna module 23 can be efficiently absorbed and dissipated.

Examples of the heat dissipation sheets 20a and 20b for internal components and the antenna heat dissipation sheet 20c include graphite sheets. By using the graphite sheet, locally generated heat can be conducted to the entire graphite sheet. For that reason, the heat dissipation sheets 20a and 20b for internal components and the antenna heat dissipation sheet 20c can conduct heat to the outside while diffusing heat.

The thermal conductivity of the materials used as the heat dissipation sheets 20a and 20b for internal components and the antenna heat dissipation sheet 20c only needs to be high enough to efficiently conduct the absorbed heat to the inside or outside of the electronic device. For example, as the material of the heat dissipation sheets 20a and 20b for internal components and the antenna heat dissipation sheet 20c, a material having a horizontal thermal conductivity of 1000 W/(m·K) or more may be used.

Each of the second metal plate 24b and the third metal plate 24c may be thermally connected to the battery 18 that supplies power to the electronic device 1. Although it is not an essential condition that the second metal plate 24b and the third metal plate 24c are thermally connected to the battery 18, in the following, a case where the second metal plate 24b and the third metal plat 24c are thermally connected to the battery 18 will be described as an example.

When the second metal plate 24b and the third metal plate 24c are thermally connected to the battery 18, each of the second metal plate 24b and the third metal plate 24c is thermally connected to the battery 18 through the antenna heat dissipation sheet 20c. That is, the heat absorbed by the second metal plate 24b and the third metal plate 24c is conducted to the battery 18 through the antenna heat dissipation sheet 20c. In this case, the battery 18 functions as a heat absorber.

With this configuration, since the heat absorbed by the second metal plate 24b and the third metal plate 24c can be dissipated from the battery 18, compared with the case where the second metal plate 24b and the third metal plate 24c are not thermally connected to the battery 18, the heat dissipation effect can be further improved. The second metal plate 24b may be in direct contact with the battery 18 without using the antenna heat dissipation sheet 20c.

The second metal plate 24b is provided on a side (negative direction side of the Z-axis) opposite to the electronic device 1 from the first metal plate 24a side in the battery 18 that supplies power to the electronic device 1. In other words, the second metal plate 24b is provided on the back surface member 4 side in the battery 18. With this configuration, since the battery 18 is present between the first metal plate 24a and the second metal plate 24b, heat can be refrained from buffering between the first metal plate 24a and the second metal plate 24b, and the heat dissipation effect can be enhanced. The third metal plate 24c is provided on the side (positive direction side of the X-axis) opposite to the side surface member 3 side in the antenna module 23.

Embodiment 2

Figure 2A:
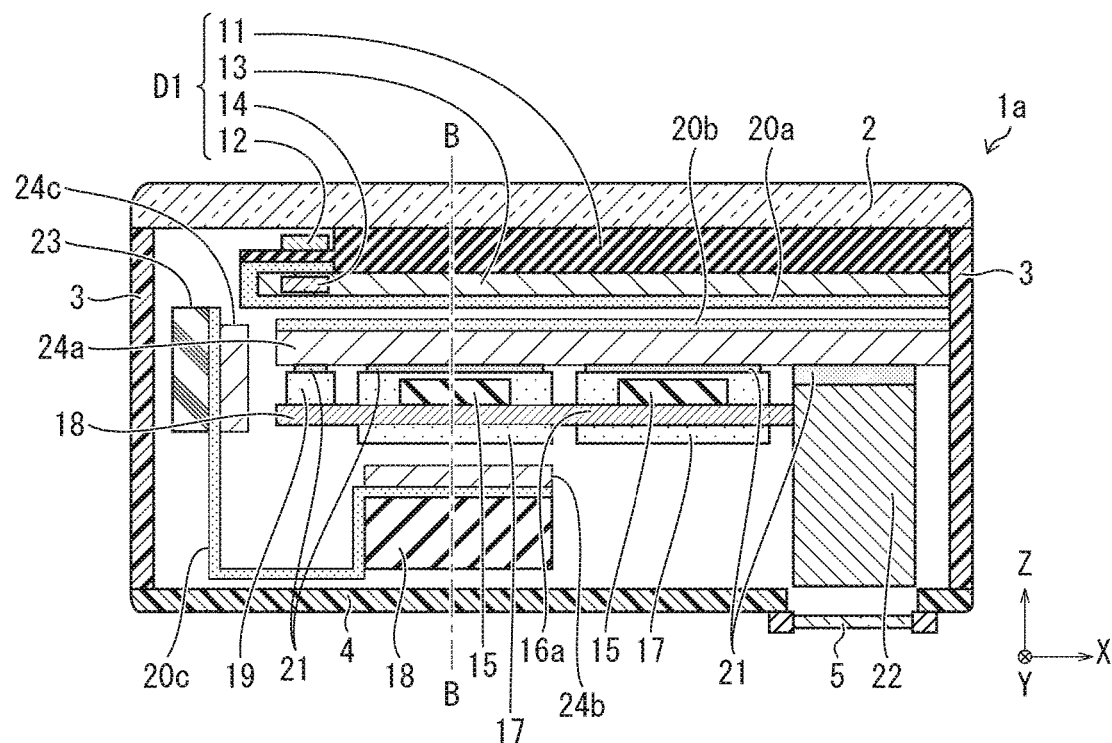
FIG. 2A is a cross-sectional view illustrating a cross-sectional configuration of an example of an electronic device according to Embodiment 2 of the present disclosure.

Another embodiment of the present disclosure will be described below. For convenience of explanation, members having the same functions as those described in the embodiment described above are given the same reference numerals, and the description thereof will not be repeated. FIG. 2A is a cross-sectional view illustrating a cross-sectional configuration of an example of an electronic device 1a according to Embodiment 2 of the present disclosure, and FIG. 2B is a cross-sectional view illustrating a cross-sectional configuration of an electronic device 1a taken along line B-B in FIG. 2A.

Figure 2B:
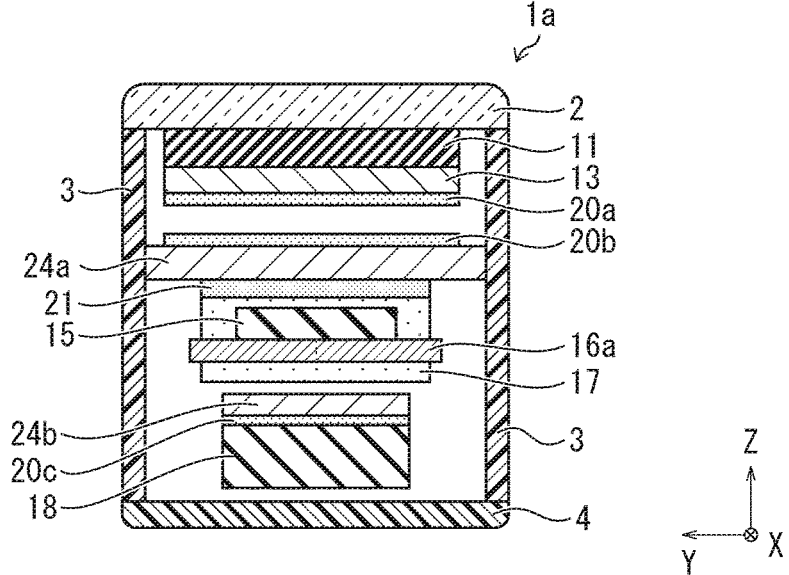
FIG. 2B is a cross-sectional view of the electronic device taken along line B-B illustrated in FIG. 2A.

As illustrated in FIGS. 2A and 2B, the electronic device 1a is different from the electronic device 1 in that disposition of the battery 18 and the second metal plate 24b is different, the substrate 16 is changed to a substrate 16a, and two control circuits 15 and shield cases 17 are present. In the electronic device 1a, the second metal plate 24b is provided on the first metal plate 24a side (positive side of the Z-axis) in the battery 18. In other words, the second metal plate 24b is provided on the side opposite to the battery 18 from the back surface member 4 side.

In the electronic device 1a, the substrate 16a is disposed between the first metal plate 24a and the second metal plate 24b. The substrate 16a is a substrate having a size larger than that of the substrate 16. Two control circuits 15 and a communication modem chip 19 are disposed on the substrate 16a. Three or more control circuits 15 and a plurality of communication modem chips 19 may be disposed on the substrate 16a.

Each of the two control circuits 15 is sealed with the shield case 17. The heat conduction member 21 is disposed between the first metal plate 24a and each of the two control circuit 15. Specifically, the heat conduction member 21 is disposed between the first metal plate 24a and each of the two shield cases 17.

Thus, the following effects are obtained by disposing the substrate 16a between the first metal plate 24a and the second metal plate 24b. Specifically, since the substrate 16a is present between the first metal plate 24a and the second metal plate 24b, heat is refrained from buffering between the first metal plate 24a and the second metal plate 24b, and the heat dissipation effect can be enhanced.

Embodiment 3

Figure 3:
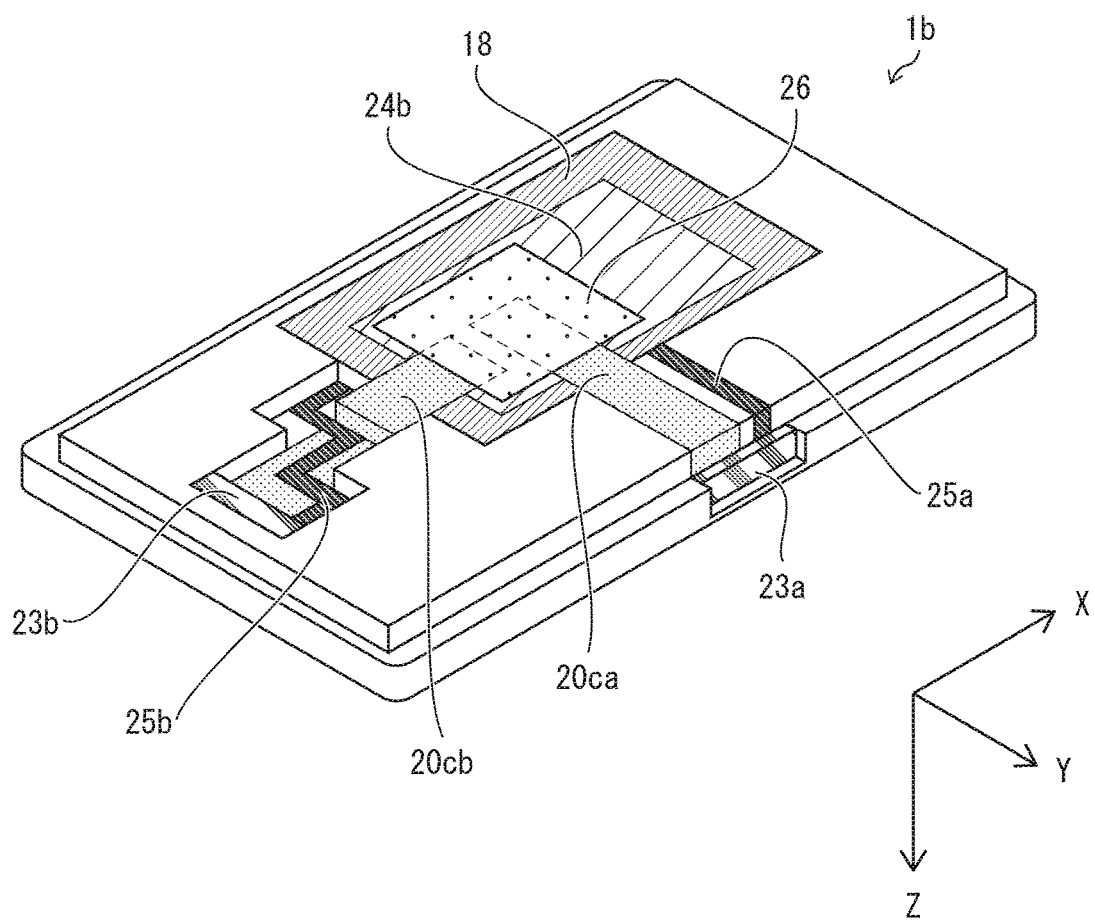
FIG. 3 is a perspective view illustrating an internal structure of an example of an electronic device according to Embodiment 3 of the present disclosure.

Another embodiment of the present disclosure will be described below. For convenience of explanation, members having the same functions as those described in the embodiments described above are given the same reference numerals, and the description thereof will not be repeated. FIG. 3 is a perspective view illustrating an internal structure in an example of an electronic device 1b according to Embodiment 3 of the present disclosure.

As illustrated in FIG. 3, the electronic device 1b is different from the electronic device 1 in that two antenna modules are present and three antenna heat dissipation sheets are present. In the electronic device 1b, an antenna module 23a is provided in the vicinity of the side surface of the electronic device 1b, and an antenna module 23b is provided in the vicinity of the back surface of the electronic device 1b. The electronic device 1b may include three or more antenna modules. By providing the electronic device 1b with a plurality of antenna modules, the electronic device 1b can transmit and receive communications with the outside from various directions.

An antenna heat dissipation sheet 20ca is provided across the antenna module 23a and the second metal plate 24b, and an antenna heat dissipation sheet 20cb is provided across the antenna module 23b and the second metal plate 24b. That is, the antenna heat dissipation sheet 20ca can conduct heat of the antenna module 23a to the second metal plate 24b, and the antenna heat dissipation sheet 20cb can conduct heat of the antenna module 23b to the second metal plate 24b.

The antenna heat dissipation sheet 26 is provided so as to cover a part of the antenna heat dissipation sheets 20ca and 20cb and a part of the second metal plate 24b. A contact area between the antenna heat dissipation sheet 26 and the second metal plate 24b is larger than a contact area between the antenna heat dissipation sheet 20ca and the second metal plate 24b and a contact area between the antenna heat dissipation sheet 20b and the second metal plate 24b. With this configuration, the heat conducted by the antenna heat dissipation sheets 20ca and 20cb can be conducted to the second metal plate 24b over a wide range by the antenna heat dissipation sheet 26.

Furthermore, the antenna module 23a is electrically connected to the substrate 16 through a flexible substrate 25a, and the antenna module 23b is electrically connected to the substrate 16 through the flexible substrate 25b. The flexible substrate 25a is not in contact with the antenna heat dissipation sheet 20ca. The flexible substrate 25b is in contact with the antenna heat dissipation sheet 20cb. The second metal plate 24b is in direct contact with the battery 18.

As illustrated in FIG. 3, although heat of a plurality of antenna modules may be absorbed by one second metal plate 24b, the heat of the plurality of antenna modules may be absorbed by a plurality of second metal plates. Specifically, the antenna module and the second metal plate may have a one-to-one relationship, and, for example, the heat of the antenna module 23a may be absorbed by one second metal plate, and the heat of the antenna module 23b may be absorbed by one second metal plate.

That is, the second metal plate that absorbs the heat of the antenna module 23a may be separate from the second metal plate that absorbs the heat of the antenna module 23b. With this configuration, heat of each antenna module is absorbed by a separate heat absorber. Therefore, heat generated from each antenna module canal be sufficiently absorbed and dissipated, and communication processing can be stabilized.

Summarization

According to a first aspect of the present disclosure, there is provided an electronic device including a first heat absorber that absorbs heat of a first heat generation source configured by a first heat generation component that generates heat inside the electronic device and a second heat absorber that absorbs heat of a second heat generation source configured to include at least an antenna module, in which the second heat absorber is disposed at a position separated from the first heat absorber.

A second aspect of the present disclosure provides the electronic device according to the first aspect, in which the first heat generation source may include a communication modem chip that controls the antenna module as the first heat generation component.

A third aspect of the present disclosure provides the electronic device according to the first or second aspect, in which the second heat absorber may be thermally connected to a battery that supplies power to the electronic device.

A fourth aspect of the present disclosure provides the electronic device according to any one of the first to third aspects, in which the second heat absorber may be provided on a side opposite to the first heat absorber side in a battery that supplies power to the electronic device.

A fifth aspect of the present disclosure provides the electronic device according to any one of the first to fourth aspects, in which the antenna module and the second heat absorber may be provided with an antenna heat dissipation sheet that conducts heat of the antenna module to the second heat absorber.

A sixth aspect of the present disclosure provides the electronic device according to any one of the first to fifth aspects, in which first heat generation source may include a display panel that displays an image as the first heat generation component, the first heat absorber may be a plate-like member provided on the back surface side of the display panel, and the display panel and the first heat absorber may be provided with a heat dissipation sheet for internal components that conducts heat of the display panel to the first heat absorber.

The present disclosure is not limited to the respective embodiments described above, and various modifications may be made thereto within the scope set forth in the claims, and embodiments obtained by appropriately combining technical means respectively disclosed in different embodiments are also included in the technical scope of the present disclosure. Furthermore, new technical features can be formed by combining technical means disclosed in the respective embodiments.

The present disclosure contains subject matter related to that disclosed in Japanese Priority Patent Application JP 2018-197723 filed in the Japan Patent Office on. Oct. 19, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device comprising:
   a first heat absorber that absorbs heat of a first heat generation source configured by a first heat generation component that generates heat inside the electronic device; and
   a second heat absorber that absorbs heat of a second heat generation source configured to include at least an antenna module,
   wherein the second heat absorber is disposed at a position separated from the first heat absorber, and is provided opposite from the first heat absorber across a battery that supplies power to the electronic device.

2. The electronic device according to claim 1,
wherein the first heat generation source includes a communication modem chip that controls the antenna module as the first heat generation component.

3. The electronic device according to claim 1,
wherein the second heat absorber is thermally connected to the battery that supplies power to the electronic device.

4. The electronic device according to claim 1,
wherein the antenna module and the second heat absorber are provided with an antenna heat dissipation sheet that conducts heat of the antenna module to the second heat absorber.

5. The electronic device according to claim 1,
wherein the first heat generation source includes a display panel that displays an image as the first heat generation component, the first heat absorber is a plate-like member provided on a back surface side of the display panel, and the display panel and the first heat absorber are provided with an internal component heat dissipation sheet that conducts heat of the display panel to the first heat absorber.

6. An electronic device comprising:
a first heat absorber that absorbs heat of a first heat generation source configured by a first heat generation component that generates heat inside the electronic device; and
a second heat absorber that absorbs heat of a second heat generation source configured to include at least an antenna module,
wherein the second heat absorber is disposed at a position separated from the first heat absorber and is provided with a substrate that is disposed between the first heat absorber and the second heat absorber.

* * * * *